United States Patent
Utter

(10) Patent No.: US 12,107,589 B2
(45) Date of Patent: Oct. 1, 2024

(54) VERNIER PHASE LOCKED LOOP

(71) Applicant: The Aerospace Corporation, El Segundo, CA (US)

(72) Inventor: Alexander Clifton Utter, Hawthorne, CA (US)

(73) Assignee: THE AEROSPACE CORPORATION, El Segundo, CA (US)

( * ) Notice: Subject to any disclaimer, the term of this patent is extended or adjusted under 35 U.S.C. 154(b) by 56 days.

(21) Appl. No.: 18/066,542

(22) Filed: Dec. 15, 2022

(65) Prior Publication Data
US 2024/0204788 A1 Jun. 20, 2024

(51) Int. Cl.
| | |
|---|---|
| H03L 7/099 | (2006.01) |
| G01S 19/21 | (2010.01) |
| H03L 7/07 | (2006.01) |
| H03L 7/087 | (2006.01) |
| H04B 17/13 | (2015.01) |
| H04L 7/033 | (2006.01) |

(52) U.S. Cl.
CPC .......... H03L 7/0992 (2013.01); G01S 19/21 (2013.01); H03L 7/07 (2013.01); H03L 7/087 (2013.01); H04B 17/13 (2015.01); H04L 7/033 (2013.01)

(58) Field of Classification Search
CPC ......... H03L 7/0992; H03L 7/07; H03L 7/087; H04B 17/13; G01S 19/21; H04L 7/033
USPC ............... 342/357.59, 357.68; 375/206, 376
See application file for complete search history.

(56) References Cited

U.S. PATENT DOCUMENTS 6,833,764 B1 * 12/2004 Dean ................ H03L 7/23
331/11

OTHER PUBLICATIONS

Brashear, et al., "A Precision Pure Clock Distribution System", Proceedings of Science, 2019.
Li, Peiji, "Time Synchronization of White Rabbit Network Based on Kalman Filter", IEEE, 2019.
Moreira, et al., "Digital Dual Mixer Time Difference for Sub-Nanosecond Time Synchronization in Ethernet".
Moreira, et al., "Digital Femtosecond Time Difference Circuit for CERN's Timing System".
Moreira, et al., "Sub-Nanosecond Digital Phase Shifter for Clock Synchronization Applications".
Rizzi, "White Rabbit Clock Characteristics", IEEE 2016.

* cited by examiner

Primary Examiner — Arnold M Kinkead
(74) Attorney, Agent, or Firm — LeonardPatel PC

(57) ABSTRACT

An apparatus that measures elapsed time in digital systems with multiple clocks includes a vernier reference (VREF) configured to generate a reference counter signal with a numeric output and two reference clock signals. The apparatus also includes a plurality of synchronizer VPLLs configured to receive the reference counter signal and the two reference clock signals and generate a plurality of synchronized counters, each synchronized counter being co-linear with the reference counter and operating in a respective target clock domain.

26 Claims, 12 Drawing Sheets

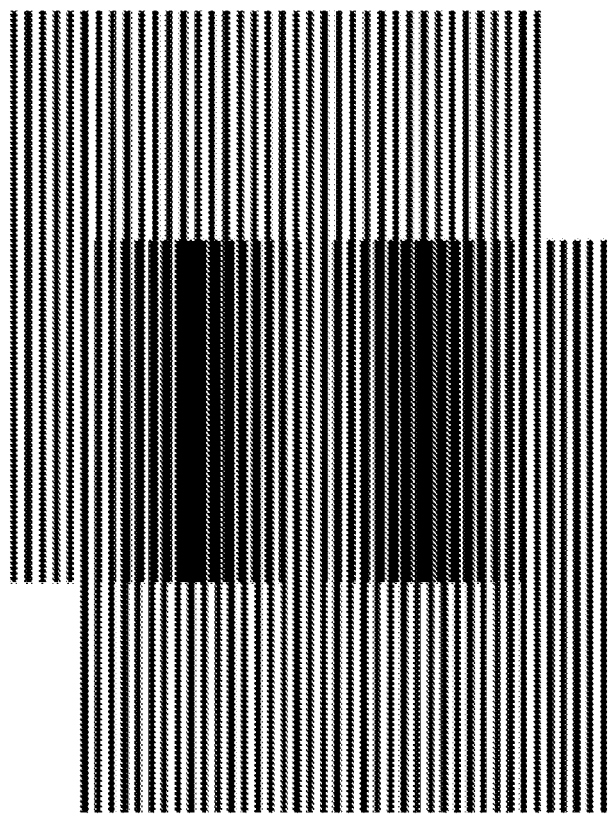
Fig. 3
300

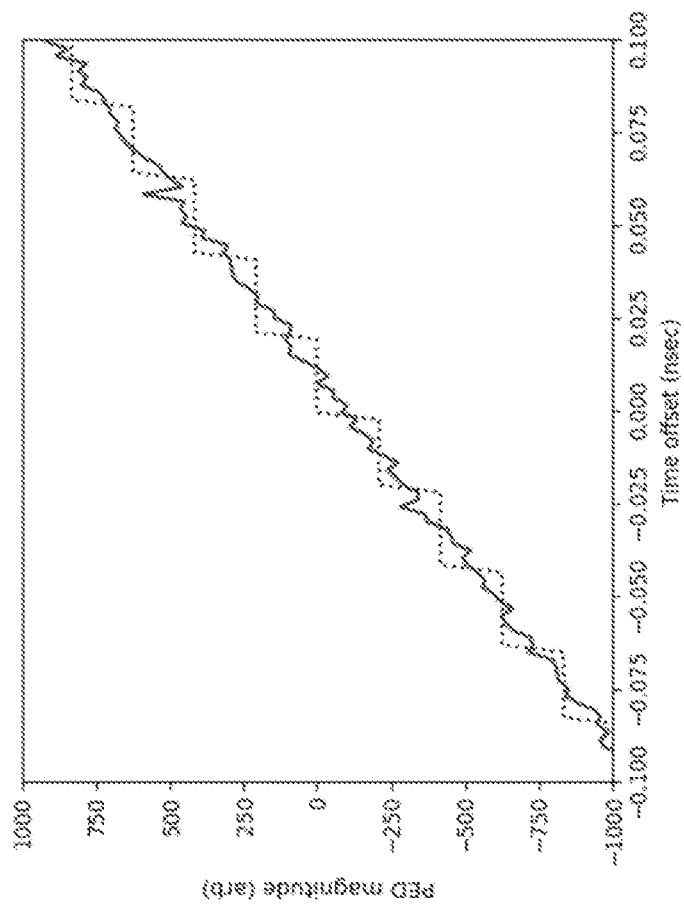
Fig. 6

VERNIER PHASE LOCKED LOOP

FIELD

The present invention relates to measuring elapsed time between two events, and more particularly, to a vernier phase locked loop configured to measure elapsed time between two events in different digital clock domains.

BACKGROUND

The crux of the problem is measuring time, and in particular, measuring elapsed time between two events. In short, the assumption is that there is an event that happens in one clock domain and an event that happens in another clock domain, where each clock domain is operated by a digital clock repeating at regular intervals.

Many systems require the precise measurement of time. Under the right circumstances, sequential digital circuits can sometimes measure time with a resolution finer than the underlying clock period. Digital circuits for this purpose have many design options with different tradeoffs for accuracy, precision, complexity, and other considerations.

State of the art for high precision digital time measurements is the digital dual mixer time-difference (DDMTD) technique. See, for example, FIG. 1, which is a diagram of a related art illustrating a DDMTD 100, where inputs are syntonized clocks and flip-flop outputs are time-stretched square waves, for phase comparisons.

In DDMTD 100, flip-flops sample the instantaneous value of each input clock signal on every rising edge of the synthesized clock. The small frequency difference of the synthesized clock ensures that, compared to the two inputs, its rising edge slips by a small amount on each subsequent clock cycle, so the sampled outputs become time-stretched square-waves at the beat frequency. The relative phase of the two time-stretched signals indicates the phase or time difference between the two input clocks. The discrete-time resolution is inversely proportional to the beat frequency, which can be made very small. Implementations of DDMTD 100 can allow measurements with sub-picosecond resolution, and DDMTD 100 is a key enabler for applications such as the White Rabbit Synchronous-Ethernet switch.

However, DDMTD 100 has a harsh limitation. Specifically, the two input clocks must be syntonized, i.e., derived from a common source and having exactly the same frequency over relevant timescales. Without this constraint, DDMTD 100 cannot be applied.

Thus, an alternative approach for solving two or more asynchronous clocks without massive loss of precision is needed.

SUMMARY

Certain embodiments of the present invention may provide solutions to the problems and needs in the art that have not yet been fully identified, appreciated, or solved by current DDMTD techniques. For example, some embodiments of the present invention pertain to a technique configured to measure elapsed time in digital systems with multiple clocks.

In one embodiment, an apparatus that measures elapsed time in digital systems with multiple clocks includes a vernier reference (VREF) configured to drive a plurality of vernier phase locked loops (VPLL), one for each target clock of interest. VREF is configured to generate a reference counter signal with an N-bit numeric output and two reference clock signals. The apparatus also includes a plurality of synchronizer VPLLs configured to receive the reference counter signal and the two reference clock signals and generate a plurality of synchronized counters, each synchronized counter being co-linear with the reference counter and operating in a respective target clock domain.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which:

FIG. 3 is a diagram illustrating graphical representation of vernier clocks at a 17:16 ratio and the moiré pattern formed by their intersection, according to an embodiment of the present invention.

FIG. 6 is a graph illustrating the same simulation results, magnified to display the small-signal response for time offsets up to ±100 ps, according to an embodiment of the present invention.

DETAILED DESCRIPTION OF THE EMBODIMENTS

Some embodiments generally pertain to a technique configured to measure elapsed time in digital systems with multiple clocks. For example, a frequency synthesizer generates two similar-frequency reference clocks (i.e., two closely-spaced reference clocks) from a common external clock. Instead of multiplying by n/n+1, a first reference clock is multiplied by n/n+1 and a second reference clock is multiplied by n+2/n+1. It should be noted that the exact ratios are not relevant so long as they are close.

The reference clocks are then sampled against any number of target clocks for which the time difference is to be identified. None of the clocks are tied to each other except for the two reference clocks. A numeric count may also be driven from one of the reference clocks. This defines a best-fit line, i.e., a global reference.

A digital circuit operating in each target clock domain predicts the sequential discrete-time values of the sampled reference clocks. This digital circuit may be referred to as vernier phased-lock loop (VPLL) and vernier phase error detector (VPED). The VPLL and VPED may work in concert because the system is a closed looped system.

The VPED determines the difference in estimated time or phase between the two predicted clocks and the two sampled reference clocks. The VPLL accumulates the error measurements to drive a closed-loop synchronized counter. In embodiments with a numeric counter that defines a global reference, the synchronized counter closely follows the same best-fit line.

To measure delay between two events "start" and "stop", a digital circuit records the value of a synchronized counter on the clock cycle associated with each event. The events may be associated with a single target clock or with different target clocks. The two synchronized counter values are subtracted, and since each synchronized counter tracks the same best-fit line, the difference in value between the two counter values is the elapsed time.

Synchronized Counter Concept

Figure 1:
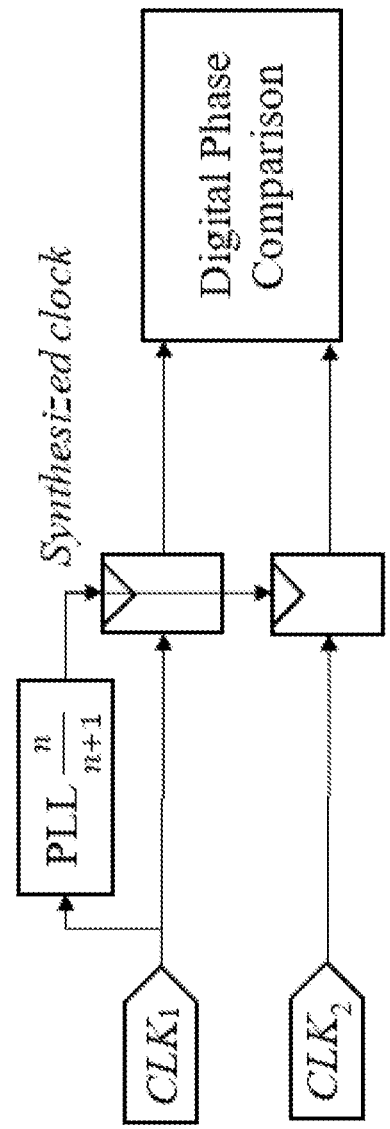
FIG. 1 is a diagram of a related art illustrating a DDMTD, where inputs are syntonized clocks and flip-flop outputs are time-stretched square waves, for phase comparisons.
Figure 2:
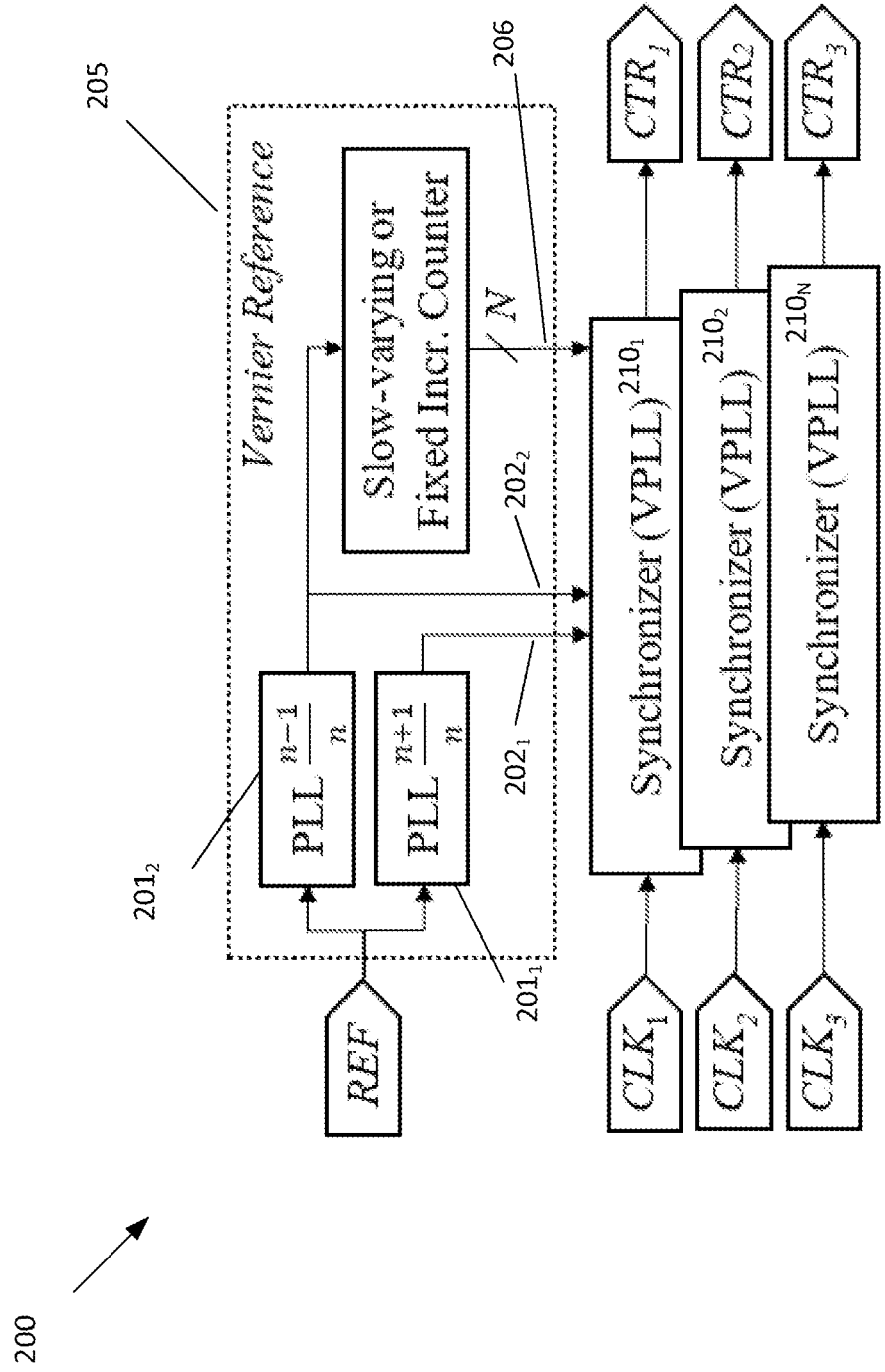
FIG. 2 is a circuit diagram illustrating one vernier reference driving any number of vernier phase locked loops, one for each target clock of interest, according to an embodiment of the present invention.

To measure time in asynchronous clock domains, the ideal form of that measurement must first be defined. FIG. 2 is a circuit diagram 200 illustrating one vernier reference (VREF) 205 driving any number of vernier phase locked loops (VPLLs), one for each target clock of interest (e.g., $CLK_1$, $CLK_2$, $CLK_3$), according to an embodiment of the present invention. VREF 205 synthesizes two reference clocks of similar frequency $202_1$ and $202_2$, which will be discussed in the following section. VREF 205 also generates a reference counter signal 206 with an N-bit numeric output, operating in one of the two reference clock domains. In this embodiment, each synchronizer $210_1 \ldots 210_N$ uses a VPLL to generate a synchronized counter (e.g., $CTR_1$, $CTR_2$, $CTR_3$) that is co-linear with the reference counter 206, but operates in the respective target clock domain.

Also, in this embodiment, clock synthesis circuits $201_1$ and $201_2$ are configured to accept an external clock (REF) and derive reference clocks $202_1$ and $202_2$ using a frequency-multiplying clock synthesizer. In some embodiments, the clock synthesis circuits $201_1$ and $201_2$ use a phase-locked loop (PLL) in a fractional-multiplier configuration. Also, in some embodiments, the clock synthesis circuits $201_1$ and $201_2$ act as a single unit by jointly sharing certain circuit elements.

In its simplest form, reference counter 206 starts at zero and increments by a fixed amount on each rising edge of the associated reference clock. In this embodiment, the only requirement is that the reference counter increment is fixed or slow-varying. More complex implementations may gradually tune the numeric increment to lock the counter to an external reference. The external reference may be any numeric sequence that defines a best-fit line, such as the elapsed time from a predefined epoch. In some embodiments, the external reference is a Precision Time Protocol (PTP) master clock, with a numeric time sequence distributed over a local area network. In some embodiments, the external reference is a Global Navigation Satellite Service (GNSS), such as the Global Positioning System (GPS), which distributes a numeric time sequence using radio broadcasts from satellites. For each of a plurality of VREF, locking the reference counter to the same widely-distributed external reference ensures that all synchronized counters are co-linear, even if they are connected to different VREF or separated by extreme distances. In some embodiments, synchronized counter values are conveyed over a wired or wireless communications system to allow elapsed-time measurements at any distance.

Let's say for an example that an omniscient oracle notes the exact time of each rising clock edge and the associated counter value. That series of time and value pairs defines a best-fit line over any given interval. The reference clock may be imperfect and have its own jitter, phase noise, etc., but long-term averaging still allows very precise measurements of the underlying best-fit line.

In this example, the oracle may then extend this concept into another clock domain. Noting the exact time of each rising edge of the target clock, the oracle interpolates or extrapolates the appropriate counter value according to the local best-fit line. The oracle may repeat this task for any number of target clocks.

In some embodiments, for events occurring in sync with any given target clock domain, the timestamp for that event is the projected counter value at the corresponding clock edge. Elapsed time is the arithmetic difference between two such timestamps, regardless of the source and destination clock domains.

The synchronized counter (e.g., $CTR_1$, $CTR_2$, $CTR_3$) is a signal that approximates the output of this hypothetical oracle. A synchronizer circuit is one that generates a synchronized counter signal. By observing the reference counter outputs over time, the synthesizer circuit generates numeric timestamps on each cycle of the target clock domain. The following sections describe a practical implementation of the synchronizer circuit using a VPLL.

Vernier Reference

Let's use for example a simple circuit that samples a slow clock signal using a D flip-flop operated by a faster target clock. The sampled signal preserves some timing information from the original reference, but cannot resolve differences smaller than the target clock period. For instance, for any given zero-to-one transition in the discrete-time sequence, it is impossible to determine if the continuous-time rising edge occurred just before the sample time or just after the previous sample time.

This ambiguity causes a nonlinear "dead zone" in any time-estimation process, since a small time-difference causes no observable change in the discrete-time output. This limits the resolution of any system based on discrete-time observations of a single reference clock.

One solution to the dead zone problem is the use of vernier clock pairs, i.e., two clocks of nearly the same frequency, derived from the same reference oscillator using a fractional PLL.

In a mechanical vernier caliper, subsidiary-scale markings are inscribed at $9/10^{th}$ the scale of the primary markings. The human eye's hypersensitivity to subtle alignment offsets between the two scales enables precise length measurements. Every D flip-flop has an analogous hypersensitivity to the timing of inputs changing just before or just after the rising edge of its clock. By a similar process, the vernier clock pair can enable extremely precise time measurements.

As the two signals of a vernier clock pair shift in and out of phase alignment, they form a moiré pattern. See, for example, FIG. 3, which is a diagram 300 illustrating graphical representation of vernier clocks at a 17:16 ratio (left, right) and the moiré pattern formed by their intersection. This pattern repeats with an overall period equal to the least common multiple (LCM) of the two reference clock periods. For small frequency differences, the LCM is approximately inversely proportional to the difference in frequency.

The continuous-time vernier pattern may then be sampled in the target discrete-time domain. The sampling operation is analogous to the operation of a linear congruential generator (LCG), with target clock sample times that are evenly distributed over the LCM period. The resulting discrete-time vernier sequence is therefore a pseudorandom function of the time-offset and frequency of the target clock, i.e., it is deterministic but complex enough to be treated as random for most purposes. Worst-case assumptions regarding the period of this discrete-time sequence allow derivation of a figure of merit for worst-case time resolution.

$$\Delta T \le \frac{M_1 T_1}{LCM(M_1, M_2)} \qquad \text{Equation (1)}$$

where $M_1$ and $M_2$ are the vernier reference clock periods, $T_t$ is the target clock period, and $\Delta T$ is the smallest resolvable timestep. In practice, the achievable resolution for a given target frequency is typically 2-8 times smaller than this bound, but it is still useful for planning purposes.

At any given reference and target frequency, the figure of merit is minimized by maximizing the LCM. This allows a single reference source to service any number of synchronized counters. In designs with many target clock domains, such as a multiport Ethernet switch, this minimizes the use of scarce FPGA resources for clock-generation and clock-distribution.

In a typical FPGA, the reference PLL parameters are selected to ensure that the smallest observable time offset is well under 250 ps. As an example, consider a Xilinx 7-Series FPGA with a 25 MHz external reference oscillator. An MMCM on-chip fractional PLL is configured with multiplier 47.875 and dividers at 60.125 and 60. A divide-by-two circuit on each clock is required due to clock and data connectivity constraints in Xilinx FPGAs, bringing the effective scaling to 383/962 and 383/960, respectively. This yields effective reference clocks at approximately 9.953 and 9.974 MHz, with an LCM of just over 6.0 microseconds. This yields a figure of merit $\Delta T \le 130$ ps. For a target clock of 125 MHz, the discrete vernier sequence formed by these references gives a quantized time resolution of just 17 ps, which is confirmed by simulation results below.

In practice, the output jitter of the PLL adds a dithering effect. If the jitter exceeds the quantization step size, then random variation over multiple iterations smooths the average response, mitigating nonlinear quantization effects. This effect grants improved linearity at the cost of additional noise. Unlike quantization dead zones, unbiased noise can be mitigated by averaging observations over a longer interval, increasing potential resolution. In moderation, jitter in the vernier reference signals can improve overall system performance.

Vernier Phase Error Detector (VPED)

Figure 4:
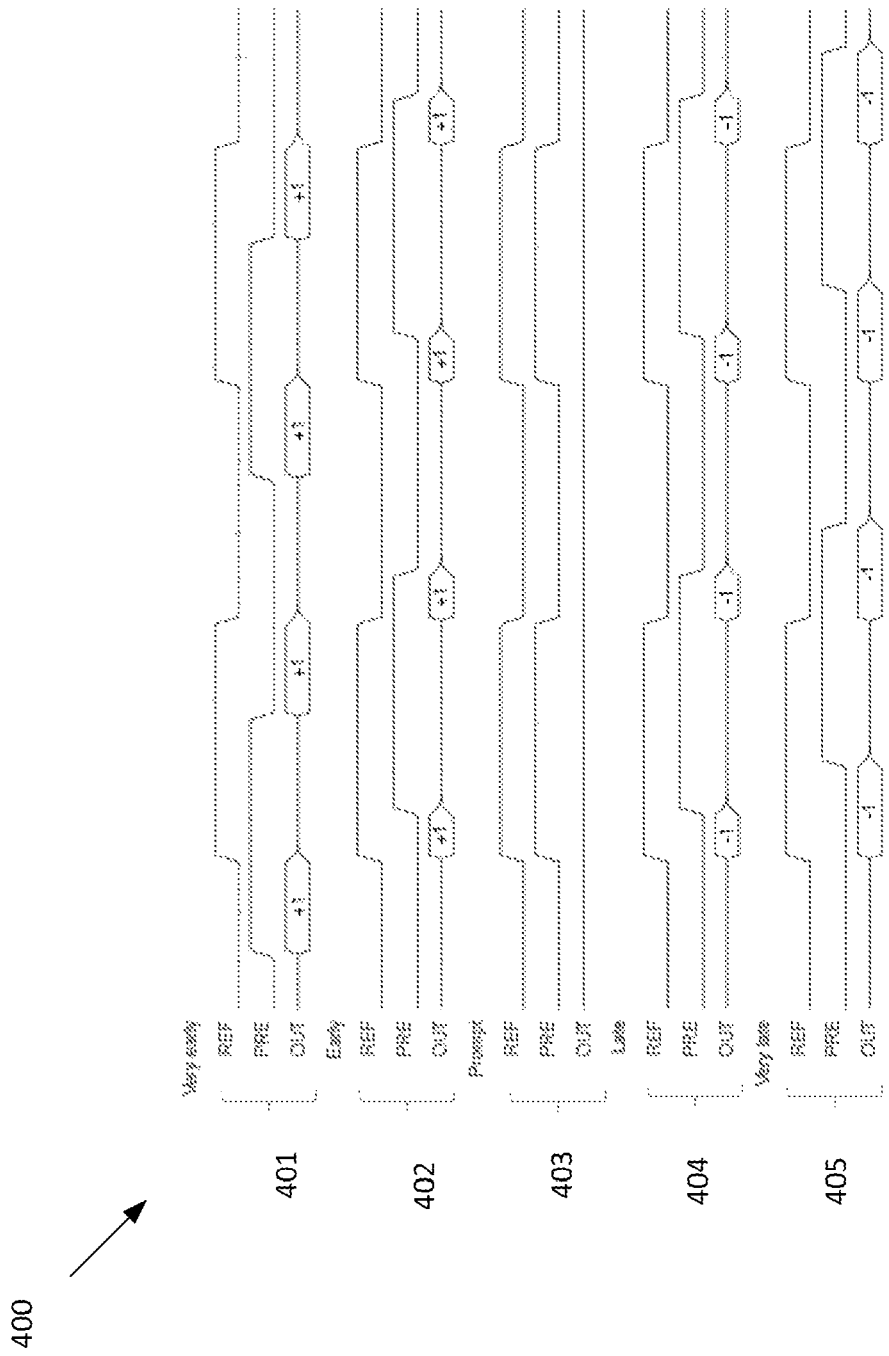
FIG. 4 is a diagram illustrating VPED operation with N=2, according to an embodiment of the present invention.

FIG. 4 is a diagram 400 illustrating VPED operation with N=2, according to an embodiment of the present invention. In diagram 400, each set of three signals (REF, PRE, OUT) show a scenario 401 . . . 405 with a different time-offset, varying over ±2 target clocks.

In some embodiments, each VPED compares a reference input (i.e., one of the two sampled reference clocks) against a predicted sequence, allowing precise measurement of phase and frequency differences. The predicted sequence is synthesized by a numerically controlled oscillator (NCO) described in the next section.

Each VPED accepts one of the clock signals from the vernier reference pair and samples it in the target clock domain. The "sampling" circuit is a sequential pair of D flip-flops operated by the target clock. The first acts as a sample-and-hold circuit triggered on each rising edge of the target clock, and the second is required to resolve metastability before the signal can be safely used. Allowing time to resolve metastability is paramount because the vernier reference exercises all possible phase alignments of the input signal and the target clock; violations of the ordinary setup- and hold-time requirements are inevitable.

Next, the VPED compares the sampled reference signal against the synthesized output from the NCO as follows. For example, if the two signals are equal, emit zero. Otherwise, if the sampled reference remains constant for at least N clock cycles, emit +1. If this is not the case, emit −1.

The "recent change" threshold N is set by the ratio of the target and reference frequencies:

$$N = \lfloor F_{target} \div 4 F_{vernier} \rfloor \qquad \text{Equation (2)}$$

For best results, the target clock frequency $F_{target}$ should be at least eight times that of each reference clock $F_{vernier}$ (i.e., N≥2) and should not be an exact multiple of either reference.

Except for the recent-change state machine, this circuit is entirely combinational, making a real-time decision during each target clock cycle. This gives a simple but effective early/late indicator for each of the vernier reference signals. FIG. 4 shows a VPED operation with N=2, with the predicted signal PRE leading (401, 402) or lagging (404, 405) compared to the reference signal REF.

Figure 5:
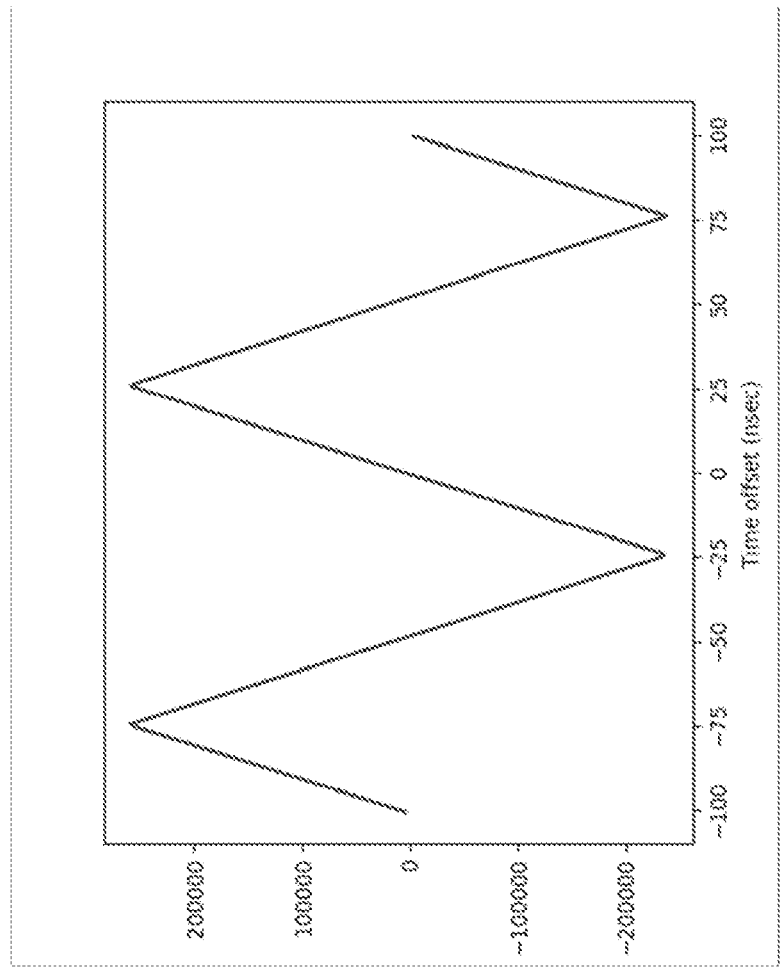
FIG. 5 is a graph illustrating simulation results of a VPED-pair operating at varying time offsets, according to an embodiment of the present invention.

FIG. 5 is a graph 500 illustrating simulation results of a VPED-pair operating at varying time offsets, according to an embodiment of the present invention. In this embodiment, the simulated vernier reference pair is generated from a 25 MHz external reference scaled by (383/962) and (383/960). The simulated target clock is 125 MHz. Also, in this embodiment, the simulation is repeated for each time offset, and the vertical axis shows the sum of all VPED outputs over a 2.0 millisecond interval.

Figure 10:
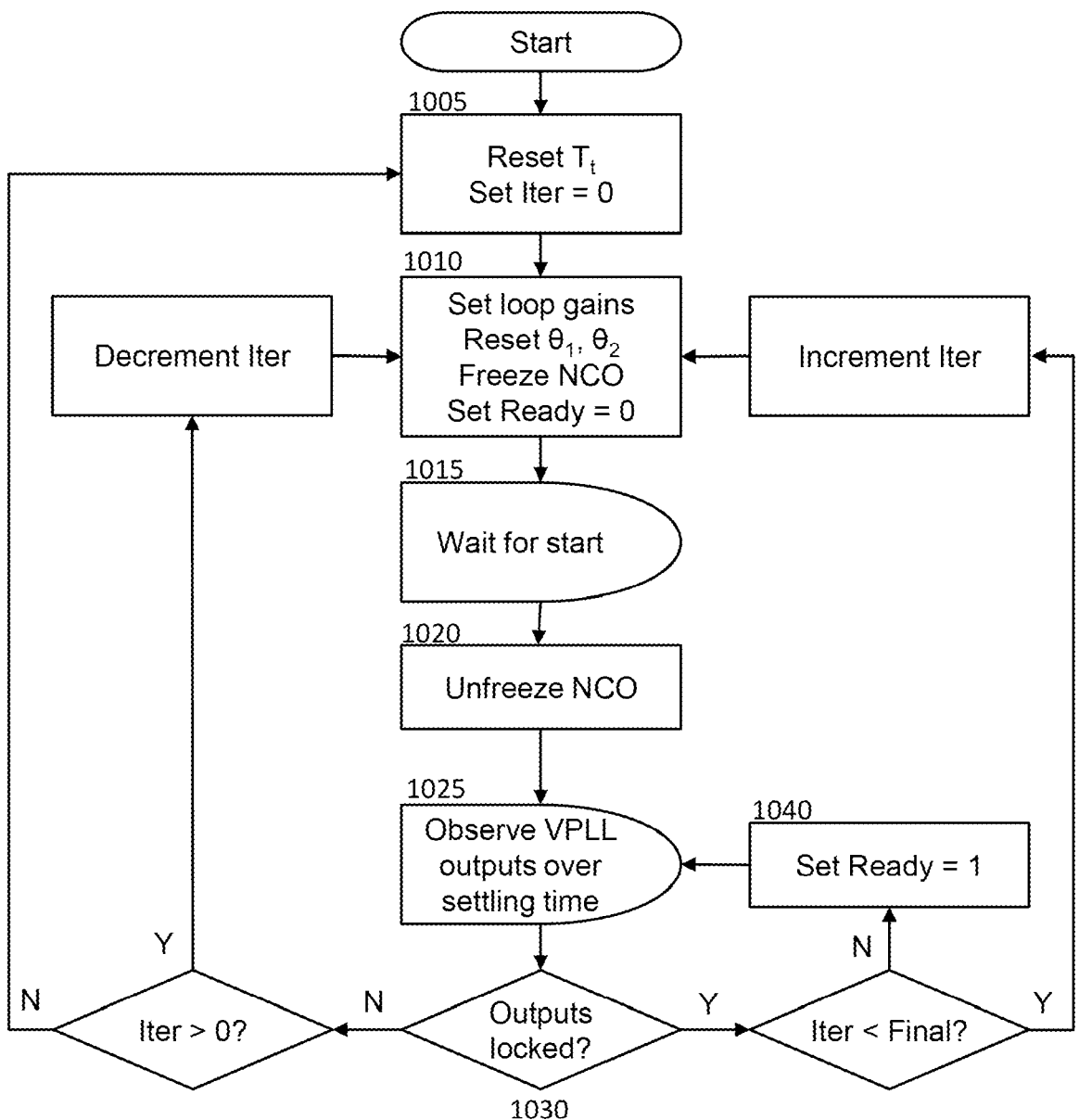
FIG. 10 is a flow diagram illustrating a method for an iterative acquisition algorithm, according to an embodiment of the present invention.

Under these conditions, the VPED output closely approximates a classic triangle-wave S-curve, with a linear range of ±25 nanoseconds (i.e., ±$M_1$/4) and a safe pull-in range of ±50 nanoseconds (i.e., ±$M_1$/2). Beyond that limit, each VPED may false-lock onto an adjacent cycle in its half of the reference pair. These false-lock conditions are stable, but the two VPEDs will no longer be aligned correctly, resulting in unacceptable output bias. Techniques for mitigating false-lock conditions are discussed in FIG. 10.

FIG. 6 is a graph 600 illustrating the same simulation results, magnified to display the small-signal response for time offsets up to ±100 ps, according to an embodiment of the present invention. In graph 600, the zero-jitter simulation (i.e., the dotted black line) shows discrete timesteps at ~17 ps intervals, consistent with the predicted vernier sequence resolution. A simulation with additive white Gaussian jitter (i.e., the solid line, σ=100 ps) shows that dither is quite effective in mitigating quantization effects, at the cost of added measurement noise.

Vernier Phase Locked Loop (VPLL)

In some embodiments, the VPLL includes two VPEDs, a loop filter, and a dual-output NCO. Together they form a closed-loop system that measures and predicts the instantaneous phase of each vernier reference clock.

Figure 7:
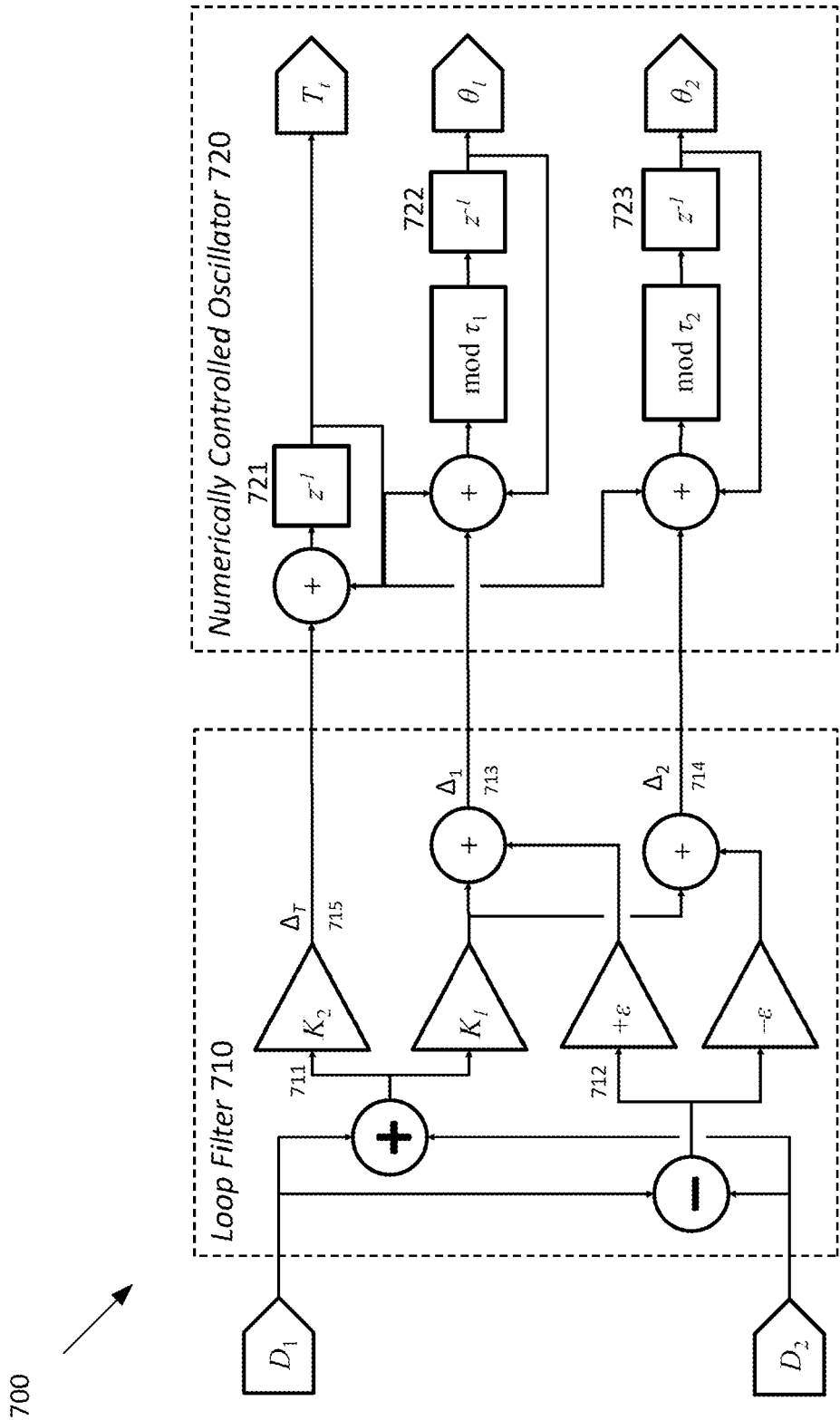
FIG. 7 is a circuit diagram illustrating a VPLL system that includes a loop filter and numerically controlled oscillator, according to an embodiment of the present invention.

FIG. 7 is a circuit diagram illustrating a VPLL system 700 that includes a loop filter 710 and numerically controlled oscillator (NCO) 720, according to an embodiment of the present invention.

Loop filter 710 accepts control signals $D_1$ and $D_2$ as inputs. In some embodiments, each control signal is driven by the output from a VPED. In some embodiments, the sum 711 and difference 712 of the control signals are multiplied by scaling factors $K_1$, $K_2$, and $\varepsilon$ to form the loop filter signals $\Delta_1$ (713), $\Delta_2$ (714), and $\Delta_T$ (715) as follows:

$$\Delta_1[n] = K_1(D_1[n] + D_2[n]) + \varepsilon(D_1[n] - D_2[n]) \quad \text{Equation (3)}$$

$$\Delta_2[n] = K_1(D_1[n] + D_2[n]) + \varepsilon(D_2[n] - D_1[n]) \quad \text{Equation (4)}$$

$$\Delta_T[n] = K_2(D_1[n] + D_2[n]) \quad \text{Equation (5)}$$

In such embodiments, scaling factors $K_1$ and $K_2$ set the loop bandwidth and damping factor of the second-order loop filter, and scaling factor $\varepsilon$ is a relatively small drift-compensation term. The drift compensation term mitigates gradual drift caused by cumulative loss of precision, e.g., due to rounding errors in the fixed-point representation of $\tau_1$ and $\tau_2$. Such errors are miniscule but would otherwise compound indefinitely. Empirically, $\varepsilon = K_1/4$ is adequate to maintain lock with negligible impact on loop bandwidth or settling time.

The loop filter output signals are connected to NCO 720. In some embodiments, the NCO comprises three accumulators 721, 722, and 723. In some embodiments, the output of ordinary accumulator 721 is the estimated target clock period $T_t$; the output of modulo accumulator 722 is the estimated phase of the first reference clock $\theta_1$; and the output of modulo accumulator 723 is the estimated phase of the second reference clock $\theta_2$.

In some embodiments, the NCO outputs are governed by the following equations:

$$\sigma_1[n+1] = (\theta_1[n] + \Delta_1[n] + T_t[n]) \bmod \tau_1 \quad \text{Equation (6)}$$

$$\sigma_2[n+1] = (\theta_2[n] + \Delta_2[n] + T_t[n]) \bmod \tau_2 \quad \text{Equation (7)}$$
$$\sigma_2[n+1] = (\theta_2[n] + \Delta_2[n] + T_t[n]) \bmod \tau_2$$

$$T_t[n+1] = (T_t[n] + \Delta_T[n]) \quad \text{Equation (8)}$$
$$T_t[n+1] = (T_t[n] + \Delta_T[n])$$

where $\Delta_1$, $\Delta_2$, $\Delta_T$ are the outputs from the loop filter; $T_t$ is the estimated period of the target clock; and $\tau_1$, $\tau_2$ are the nominal period of each reference clock. Each of these terms have units of time, i.e., picoseconds or some fixed-point representation thereof. Since $\Delta_n \ll \tau_n$ and $T_t \ll \tau_n$, the modulo terms will never wrap more than once. Therefore, practical FPGA realizations may replace the modulo operation with a much simpler compare-and-subtract.

The final NCO outputs to the VPEDs are the predicted clock signals $O_1$ and $O_2$, which are given by:

$$O_1[n] = \quad \text{Equation (9)}$$
$$1 \text{ if } \left(\theta_1[n] < \frac{1}{2}\tau_1\right) \text{ else } 0 \quad O_2[n] = 1 \text{ if } \left(\theta_2[n] < \frac{1}{2}\tau_2\right) \text{ else } 0$$

$$O_1[n] = \quad \text{Equation (10)}$$
$$1 \text{ if } \left(\theta_1[n] < \frac{1}{2}\tau_1\right) \text{ else } 0 \quad O_2[n] = 1 \text{ if } \left(\theta_2[n] < \frac{1}{2}\tau_2\right) \text{ else } 0$$

Quasi-linear operation of the NCO and VPED require a good initial guess for $\theta_1$, $\theta_2$, and $T_t$. If the initial guess is sufficiently accurate, the VPLL converges and behaves like any other second-order phase locked loop. Thanks to the VPEDs, this process is quite linear and has a small worst-case dead-zone. Once converged, $\theta_1$ and $\theta_2$ are dynamic estimates of the instantaneous phase of the two sampled reference clocks, i.e., the precise time-delay from each rising edge of the target clock to the preceding rising edge of each vernier reference clock.

The NCO outputs are used to calculate the synchronized counter value on each clock cycle. Recall that the reference counter $\Phi_{ref}$ marks the time associated with each rising edge of the first vernier reference clock. The variable $\theta_1$ is the estimated delay from that clock edge to the current cycle of the target clock. Therefore, the best-fit synchronized counter estimate $\Phi_{target}$ is given by:

$$\phi_{target}[n] = \phi_{ref}[n] + \theta_1[n] \quad \text{Equation (11)}$$

A counter register (CREG) brings the reference counter $\Phi_{ref}$ into the target clock domain. To maintain continuity and monotonicity, the value must be updated concurrently with the rollover of $\theta_1$. The CREG must also ensure that it only reads new values when the input signal is stable, to avoid timing violations and metastability problems.

This clock-domain transition is simple once the VPLL has converged. The sampled reference signal lags the original vernier reference by a small delay, because of the VPED's double-register synchronizer. Once locked, the NCO state accurately mirrors the sampled reference signal. Therefore $\theta_1$ rollover events always occur shortly after the rising edge of the original reference. Since $\Phi_{ref}$ updates on that same rising edge, and the target clock is several times faster than the reference clock, it is safe to infer that the counter value will be stable shortly before and after each rollover. As a result, CREG can use the rollover event as a clock-enable for an ordinary register $\Phi_{ref}[n]$ with no risk of metastability.

With FPGA designs, the digital logic of the VPED and NCO may need to be pipelined. To compensate for any feedforward delay, a constant offset $\Phi_{offset} = K \cdot T_t$ to the final output may be added to Equation 11.

Figure 8:
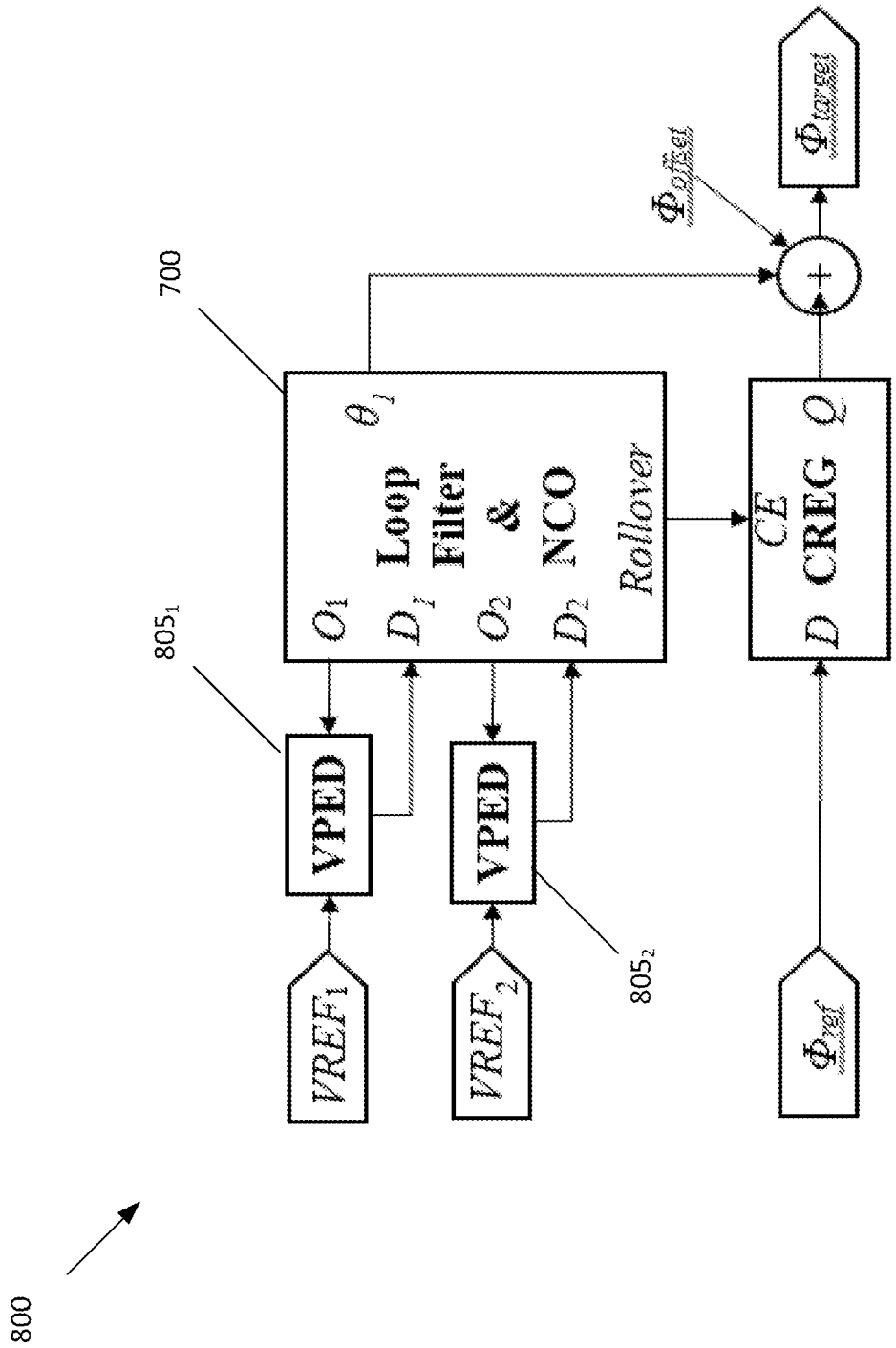
FIG. 8 is a circuit diagram illustrating a VPLL circuit, according to an embodiment of the present invention.

FIG. 8 is a circuit diagram illustrating a VPLL circuit 800, according to an embodiment of the present invention. In some embodiments, VPED 805$_1$ and 805$_2$, NCO 700 of FIG. 7, and CREG 815 all operate in the target clock domain. The output $\phi_{target}$ tracks the best-fit line defined by the reference counter. It should be noted that each VREF$_1$, VREF$_2$ and $\Phi_{ref}$ are outputs from VREF 205 of FIG. 2.

Due to the false-locking hazard, the VPLL 700 has a narrow pull-in range for initial acquisition. NCO 720 variables $\theta_1$, $\theta_2$, and $T_t$ must all be initialized carefully to ensure success.

In some embodiments, DDMTD plays an important role in this process by giving an indicator of when the two vernier clocks are precisely phase-aligned, i.e., $\theta_1 \approx \theta_2$. As noted earlier, DDMTD samples one clock signal with a synthesized clock that is almost exactly the same frequency. Since the vernier reference pair are derived from the same source, all DDMTD prerequisites are met. Therefore, using one of the vernier clocks to sample the other will produce a time-stretched square wave whose rising edge occurs when the two reference clocks are precisely phase-aligned. The period of the stretched square wave is equal to the period of the vernier pattern, $LCM(M_1, M_2)$.

Since all VPLL logic operates in the target clock domain (TCLK), a clock-domain transition is required. Because the time-stretched square wave changes infrequently, a double-registered buffer may be effective in some embodiments.

Figure 9:
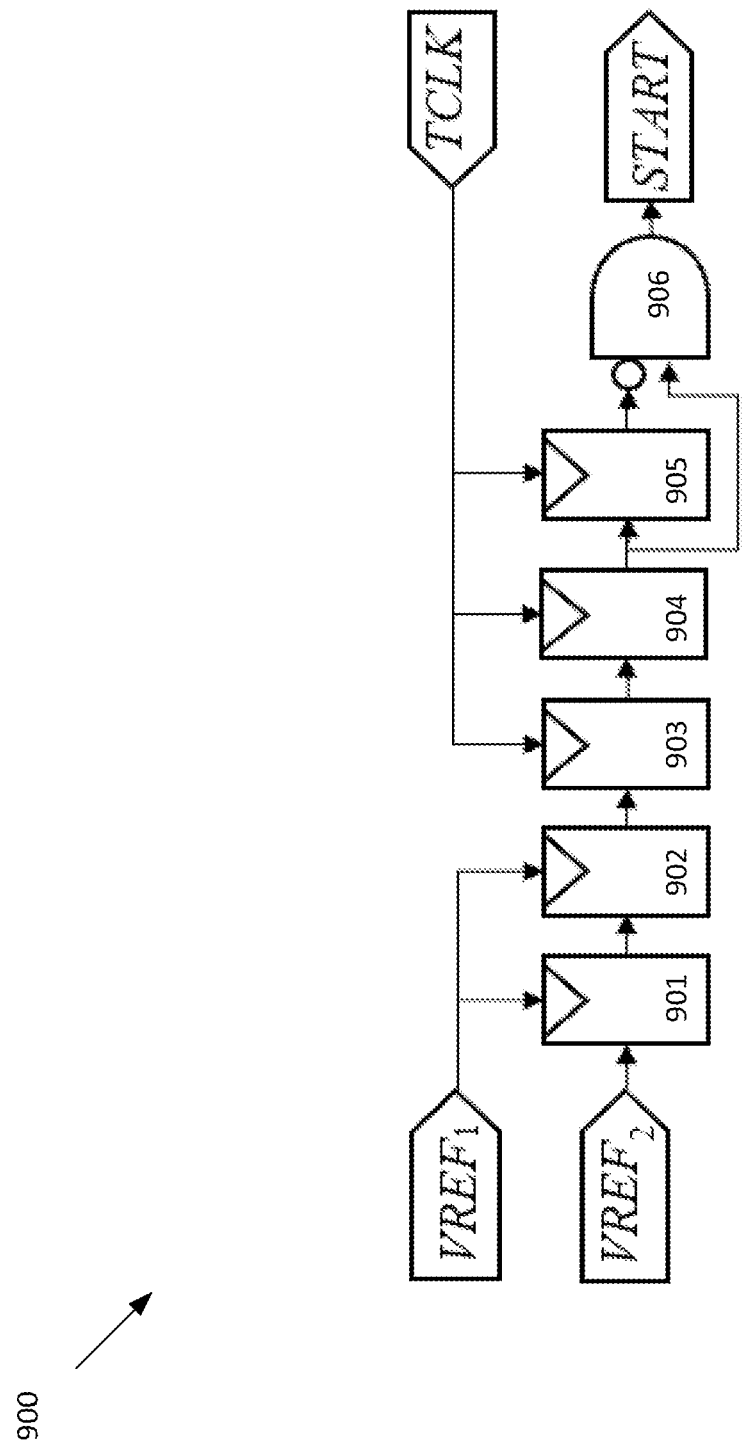
FIG. 9 is a circuit diagram illustrating a combined DDMTD and clock-domain-crossing circuit configured to generate a "START" strobe shortly after the phase-alignment event, according to an embodiment of the present invention.

FIG. 9 is a circuit diagram illustrating a combined DDMTD and clock-domain-crossing circuit 900 configured to generate a "START" strobe shortly after the phase-alignment event, according to an embodiment of the present invention. In some embodiments, the phase-alignment of the target clock TCLK relative to the two vernier references $VREF_1$ and $VREF_2$ remains unknown. For this reason, the delay through the circuit 900 of FIG. 9 is bounded within the range $[M_1+T_t, M_1+2T_t]$, i.e., an average delay of $M_1+1.5T_t$ with worst-case uncertainty of $\pm 0.5T_t$.

In some embodiments, the DDMTD and clock-domain-crossing circuit 900 consists of five flip-flops 901-905 and a logic gate 906. Flip-flop 901 samples clock $VREF_2$ using clock $VREF_1$ to generate a time-stretched square wave using the DDMTD process. The output of flip-flops 902, 903, 904, and 905 are all time-delayed representations of this time-stretched square wave. Flip-flop 902 introduces a delay to resolve metastability in the output of 901. Flip-flop 903 samples the output of 902 in the target clock domain TCLK. Flip-flop 904 introduces a delay to resolve metastability in the output of 904. Flip-flop 905 introduces a delay to allow detection of transitions in the output of 904. Logic gate 906 compares the outputs of 904 and 905 to detect transitions. In some embodiments, 906 comprises an AND gate with one input inverted.

Fortunately, this worst-case uncertainty of $\pm 0.5T_t$ is accurate enough for a useful initial guess. As noted earlier, the VPED's linear pull-in range is $\pm 0.25M_1$. Since $T_t \ll M_1$, the VPLL tolerates this level of uncertainty in its initial state. To compensate for the average delay, the NCO initial state is adjusted. Since the start strobe arrives slightly late, the most accurate initial guess is given by $\theta_1 = \theta_2 = M_1 + 1.5T_t$. Because both variables are modulo-counters and $M_1 \approx M_2$, this aliases to $\theta_1 = \theta_2 = 1.5T_t$.

The remaining unknown is $T_t$. This parameter's uncertainty is usually dominated by the frequency accuracy of the associated external oscillator(s). Depending on size, weight, power, and cost constraints, the actual period may differ from the nominal value by ±50 ppm or more. Maximum tolerable error for the initial guess depends on many factors, including the VPLL loop bandwidth. Wide loop bandwidths enhance pull-in range but result in higher operating noise and higher probability of cycle-slips.

This unfortunate design tradeoff is circumvented by iteratively refining the estimate of $T_t$. This method uses a high loop bandwidth for initial acquisition, then a progressively smaller loop bandwidth producing finer and finer estimates of $T_t$, eventually transitioning to steady-state operation. Since the method reuses the VPLL circuit, very few additional FPGA resources are required. Combined with a lock-detection test, this method produces an extremely robust process for startup and error recovery.

The iterative acquisition algorithm has a series of stages, where each stage applies a finer loop bandwidth than the previous stage. As a result, later stages require a more refined initial state but also yield a more refined estimate. To robustly mitigate various false-lock conditions, the stage advances when the lock-detection test is positive, and regresses when the lock-detection test is negative. See, for example, FIG. 10, which is a flow diagram illustrating a method 1000 for an iterative acquisition algorithm, according to an embodiment of the present invention. Method 1000 includes resetting target clock period $T_t$ to its nominal value and resetting iteration count ITER to zero, at 1005. Method 1000 includes, for each iteration, 1010 setting all loop gains based on ITER, setting $\theta_1 = \theta_2 = M_1 + 1.5T_t$, freezing the NCO state, and clearing the READY flag; then 1015 waiting for START strobe (e.g., from circuit 900 of FIG. 9); then 1020 unfreezing the NCO state; then 1025 observing VPLL outputs while waiting for expected settling time. At 1030, method 1000 includes performing, if outputs are unlocked on a first iteration (i.e., ITER=0), returning to step 1005; if outputs are unlocked on any other iteration, decrementing ITER and returning to step 1010; if outputs are locked on a non-final iteration, incrementing ITER and returning to step 1010; and if outputs are locked on a final iteration, asserting the READY flag and returning to step 1025.

Under nominal conditions, the lock-detection test will be consistently positive at the end of each iteration, and method 1000 will quickly proceed to the final iteration and reach step 1040. Step 1040 asserts the READY flag, indicating the synchronized counter value is ready for use. Method 1000 will then wait a predetermined time and re-observe the lock-detection test; repeating steps 1025 and 1040 indefinitely if the test result remains positive.

The lock-detection test is a critical part of robust VPLL initialization. It must accurately warn of false-lock detections without interrupting normal operation due to excessive false alarms. A simple but effective heuristic is to inspect the inputs to each VPED. In a locked state, the sampled reference and predicted signals should agree almost 100% of the time.

A counter-based state machine allows this accuracy to be measured over very long windows without needing much memory. If the VPED inputs agree, the counter increments by one (up to a designated maximum). If they disagree, the counter decrements by a penalty P (down to a minimum of zero). If the fraction of correct predictions exceeds P/(P+1), then the counter will steadily increase. Comparing the counter to a threshold provides a simple but effective lock indicator.

In some embodiments, VPLL may use structures that are available on most FPGA platforms. For example, two VPLL prototypes have been developed. The first uses a Xilinx VC707 development board, which contains a Virtex-7 FPGA (XC7VX485T). The second uses a Xilinx ZCU208 development board, which contains a Zynq UltraScale+ RFSoC (XCZU48DR).

The first major consideration is the choice of vernier reference parameters. As previously discussed, clock synthesis of a vernier reference pair should be designed to maximize LCM.

Each prototype uses a single MMCM to synthesize the vernier clock pair, and the allowed frequency range for each reference clock is between 19.9 and 20.1 MHz. The MMCM requirements for each target device impose constraints such as valid multiplier and divider settings, minimum and maximum VCO frequency, etc. This optimization problem is highly nonlinear, but the parameter search space is small enough to allow exhaustive search using software. The optimal MMCM parameters for various hardware platforms and external reference frequencies are shown in Table 1 and Table 2.

TABLE 1

Optimum single-MMCM parameters for Xilinx 7-Series and Ultrascale FPGAs. (Speed Grade −1 or higher.)

| Input (MHz) | M | D0 | D1 | Output (MHz) | LCM (μsec) |
|---|---|---|---|---|---|
| 20 | 59.875 | 60.125 | 60.000 | 19.917, 19.958 | 6.025 |
| 25 | 47.875 | 60.125 | 60.000 | 19.905, 19.948 | 6.028 |
| 50 | 23.500 | 58.875 | 59.000 | 19.915, 19.958 | 5.913 |
| 100 | 11.750 | 58.875 | 59.000 | 19.915, 19.958 | 5.913 |
| 125 | 9.250 | 57.874 | 58.000 | 19.935, 19.978 | 5.806 |
| 200 | 5.875 | 58.874 | 59.000 | 19.915, 19.958 | 5.913 |

TABLE 1

Optimum single-MMCM parameters for Xilinx UltraScale+ FPGAs. (Speed Grade −1 or higher.)

| Input (MHz) | M | D0 | D1 | Output (MHz) | LCM (μsec) |
|---|---|---|---|---|---|
| 20 | 63.875 | 64.125 | 64.000 | 19.922, 19.961 | 6.425 |
| 25 | 63.875 | 80.125 | 80.000 | 19.930, 19.961 | 8.028 |
| 50 | 31.875 | 79.875 | 80.000 | 19.922, 19.953 | 8.019 |
| 100 | 15.750 | 79.125 | 79.000 | 19.905, 19.937 | 7.938 |
| 125 | 12.750 | 79.875 | 80.000 | 19.922, 19.953 | 8.019 |
| 200 | 7.875 | 79.125 | 79.000 | 19.905, 19.937 | 7.938 |

The second major practical consideration is the use of separate distribution circuits for clocks and data. Clock signals typically use a limited number of global buffers that distribute the signal across the entire chip with minimal skew and jitter. Data signals typically use more plentiful but localized resources. In most FPGAs, including the Xilinx 7-series and UltraScale+ devices used in each prototype, the global clock buffers cannot connect to the data input of a flip-flop because such connections never occur in conventional digital logic designs.

Figure 11:
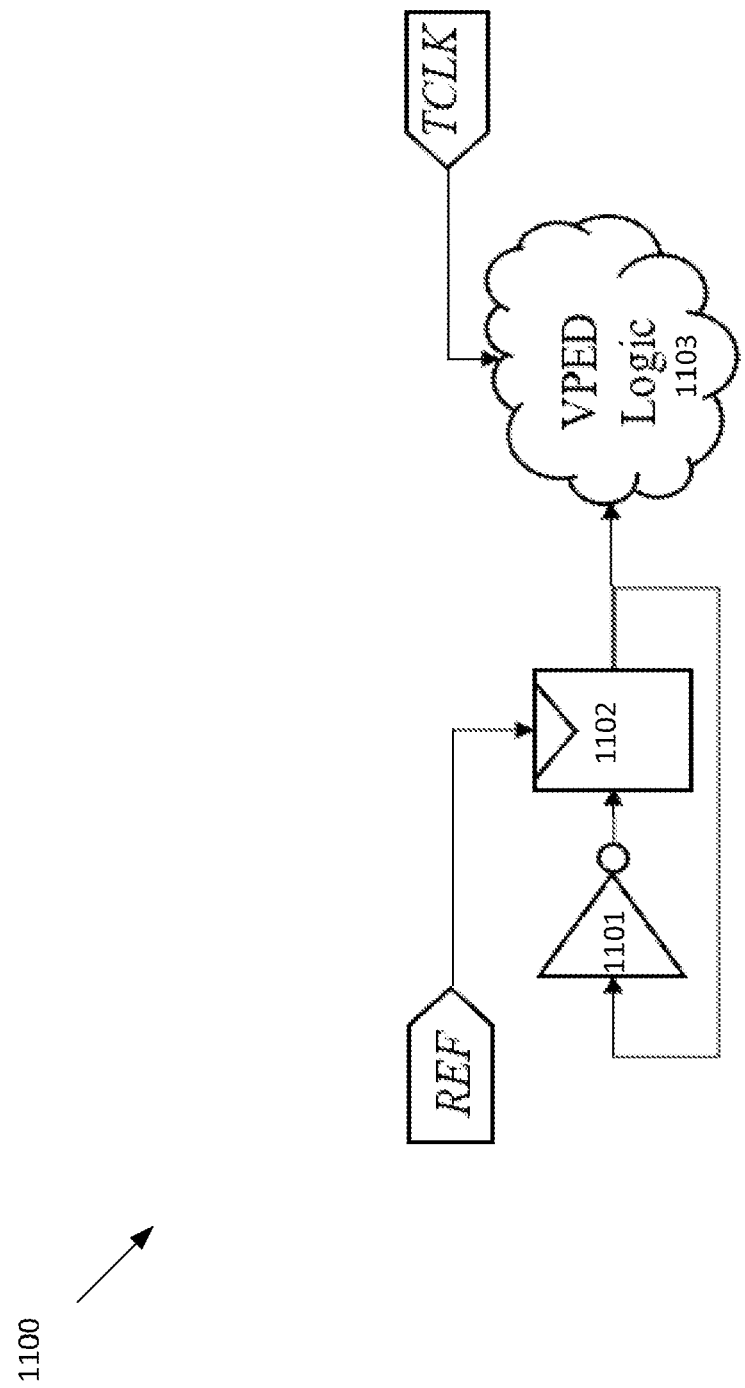
FIG. 11 is a circuit diagram illustrating a divide-by-two circuit, according to an embodiment of the present invention.

However, clock-as-input-signal connectivity is explicitly required to implement DDMTD and VPED circuits. See, for example, FIG. 11, which is a circuit diagram illustrating a divide-by-two circuit 1100, according to an embodiment of the present invention. In some embodiments, divide-by-two circuit 1100 is a simple indirect means of making such connections.

The routing of the divide-by-two signal is critical to overall system performance. To ensure routing delays are as short and predictable as possible, the divide-by-two circuit should be replicated at each point of use (i.e., max-fanout=2) to ensure place-and-route keeps the source as close as possible to each destination. The circuit is simple enough that such duplication is inexpensive.

The divide-by-two circuit 1100 accepts a reference clock REF as an input. The reference clock drives flip-flop 1102, which is connected in a feedback loop with inverter 1101 such that its output toggles on every reference clock cycle. As a result, the output of 1102 is a square wave with half the frequency of REF. In embodiments using a divide-by-two circuit, the reference input to VPED 1103 is connected to output of 1102, instead of connecting it directly to REF.

Figure 12:
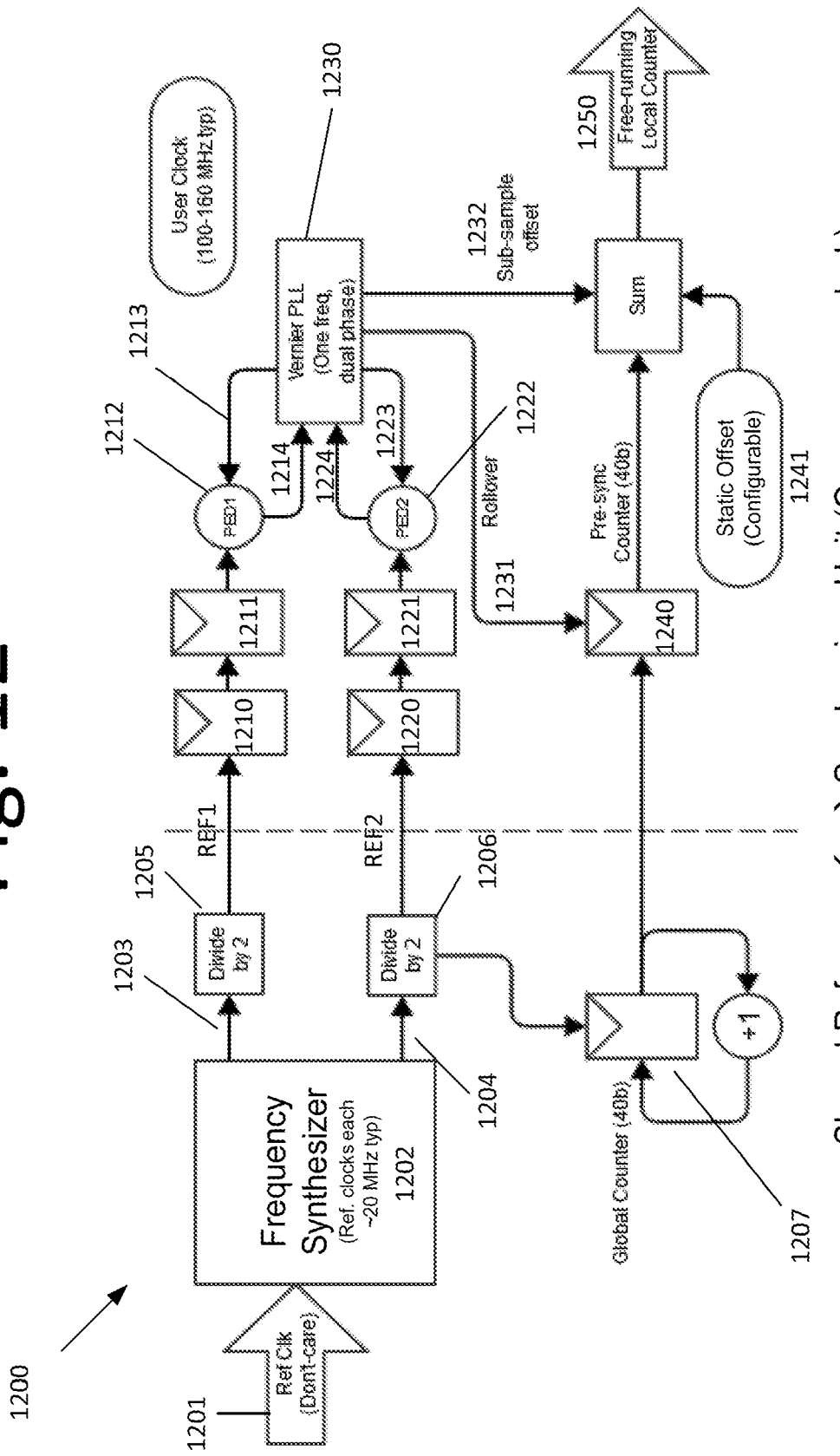
FIG. 12 is a circuit diagram illustrating a system comprising a vernier reference, vernier phase error detector and vernier phase locked loop, according to an embodiment of the present invention.

FIG. 12 is a circuit diagram illustrating a system 1200 comprising a VREF, VPED and VPLL, according to an embodiment of the present invention. In this embodiment, an external reference clock 1201 drives a frequency synthesizer 1202, which synthesizes vernier reference clocks 1203 and 1204 at closely-spaced frequencies. Each vernier reference clock drives a divide-by-two circuit (1205 and 1206) to facilitate clock-as-input-signal connectivity. Divided reference clock 1206 drives global counter 1207, which increments by one for every divided clock rising edge.

Sequential logic elements to the right of the dotted line (i.e., 1210 . . . 1251) operate in the target clock domain. The first double flip-flop synchronizer 1210 and 1211 samples reference clock REF1. Element 1211 drives the first VPED 1212, which compares against predicted clock signal 1213 to derive error signal 1214. The second double flip-flop synchronizer 1220 and 1221 samples reference clock REF2. Element 1221 drives VPED 1222, which compares against predicted clock signal 1223 to derive error signal 1224.

The VPLL 1230 comprises a loop filter and NCO, which accumulate error signals 1214 and 1224 in a closed-loop feedback process to generate predicted clock signals 1213 and 1223, the rollover strobe 1231, and the sub-sample offset 1232. Rollover strobe 1231 drives the clock-enable signal of counter register 1240, which stores the value of global counter 1207. The synchronized counter output 1250 is the sum of counter register 1240, a configurable offset 1241, and sub-sample offset 1232.

It will be readily understood that the components of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. An apparatus configured to measure elapsed time in digital systems with multiple clocks, comprising:
    a vernier reference (VREF) configured to drive a plurality of vernier phase locked loops (VPLL), one for each target clock of interest, where VREF generates a reference counter signal with an N-bit numeric output and two reference clock signals; and
    a plurality of synchronizer VPLLs configured to receive the reference counter signal and the two reference clock signals and generate a plurality of synchronized counters, each of the plurality of synchronized counters being co-linear with a best fit line defined by the reference counter and operating in a respective target clock domain.

2. The apparatus of claim 1, wherein the VREF comprises a plurality of clock circuits configured to accept an external clock signal and configured to derive or generate the two reference clock signals using a frequency-multiplying clock synthesizer.

3. The apparatus of claim 2, wherein each of the plurality of clock circuits use a PLL as a fractional multiplier to generate the two reference clock signals.

4. The apparatus of claim 1, wherein the reference counter is configured to start at zero and increment by a fixed amount on each rising edge of one of the two reference clock signals.

5. The apparatus of claim 1, wherein the reference counter is configured to track an external timing reference, wherein the external timing reference is a widely-distributed numeric sequence.

6. The apparatus of claim 1, further comprising:
    a first vernier phase error detector (VPED) and a second VPED, each of which receives one of the two reference clock signals and is configured to compare one of the two reference clock signals against a predicted sequence, allowing measurement of phase and frequency differences.

7. The apparatus of claim 6, further comprising:
    a numerically controlled oscillator configured to synthesize the predicted sequence.

8. The apparatus of claim 1, wherein each of the plurality of synchronizer VPLLs comprise
    a loop filter configured to accept a first control signal and a second control signal and to form a first loop filter signal, a second loop filter signal and third loop filter signal; and
    a numerically controlled oscillator configured to receive the first loop filter signal, the second loop filter signal and the third loop filter signal, and output an estimate target clock period, a first reference clock signal and a second reference clock signal.

9. An apparatus configured to measure elapsed time in digital systems with multiple clocks, comprising:
    a vernier reference (VREF) configured to drive a plurality of vernier phase locked loops (VPLL), one for each target clock of interest, where VREF generates a reference counter signal with an N-bit numeric output and two reference clock signals;
    a first vernier phase error detector (VPED) and a second VPED, each of which receives one of the two reference clock signals and is configured to compare one of the two reference clock signals against a predicted sequence, allowing measurement of phase and frequency differences; and
    a plurality of synchronizer VPLLs configured to receive the reference counter signal and the two reference clock signals and generate a plurality of synchronized counters, each of the plurality of synchronized counters being co-linear with a best fit line defined by the reference counter and operating in a respective target clock domain.

10. The apparatus of claim 9, wherein the VREF comprises
    a plurality of clock circuits configured to accept an external clock signal and configured to derive or generate the two reference clock signals using a frequency-multiplying clock synthesizer.

11. The apparatus of claim 10, wherein each of the plurality of clock circuits use a PLL as a fractional multiplier to generate the two reference clock signals.

12. The apparatus of claim 9, wherein the reference counter is configured to start at zero and increment by a fixed amount on each rising edge of one of the two reference clock signals.

13. The apparatus of claim 9, wherein the reference counter is configured to track an external timing reference, wherein the external timing reference is a widely-distributed numeric sequence.

14. The apparatus of claim 13, wherein the external timing reference is derived from a PTP master clock.

15. The apparatus of claim 13, wherein the external timing reference is derived from a GNSS receiver.

16. The apparatus of claim 9, further comprising:
    a numerically controlled oscillator configured to synthesize the predicted sequence.

17. The apparatus of claim 9, wherein each of the plurality of synchronizer VPLLs comprise
    a loop filter configured to accept a first control signal and a second control signal and to form a first loop filter signal, a second loop filter signal and third loop filter signal; and
    a numerically controlled oscillator configured to receive the first loop filter signal, the second loop filter signal and the third loop filter signal, and output an estimate target clock period, a first reference clock signal and a second reference clock signal.

18. An apparatus configured to measure elapsed time in digital systems with multiple clocks, comprising:
    a vernier reference (VREF) configured to drive a plurality of vernier phase locked loops (VPLL), one for each target clock of interest, where VREF generates a reference counter signal with an N-bit numeric output and two reference clock signals, wherein
    the VREF comprises a plurality of clock circuits configured to accept an external clock signal and configured to derive or generate the two reference clock signals using a frequency-multiplying clock synthesizer; and a plurality of synchronizer VPLLs configured to receive the reference counter signal and the two reference clock signals and generate a plurality of synchronized counters, each of the plurality of synchronized counters being co-linear with a best fit line defined by the reference counter and operating in a respective target clock domain.

19. The apparatus of claim 18, wherein each of the plurality of clock circuits uses a PLL as a fractional multiplier to generate the two reference clock signals.

20. The apparatus of claim 18, wherein the reference counter is configured to start at zero and increment by a fixed amount on each rising edge of one of the two reference clock signals.

21. The apparatus of claim 18, wherein the reference counter is configured to track an external timing reference, wherein the external timing reference is a widely-distributed numeric sequence.

22. The apparatus of claim 21, wherein the external timing reference is derived from a PTP master clock.

23. The apparatus of claim 21, wherein the external timing reference is derived from a GNSS receiver.

24. The apparatus of claim 18, further comprising:

a first vernier phase error detector (VPED) and a second VPED, each of which receives one of the two reference clock signals and is configured to compare one of the two reference clock signals against a predicted sequence, allowing measurement of phase and frequency differences.

25. The apparatus of claim 24, further comprising:

a numerically controlled oscillator configured to synthesize the predicted sequence.

26. The apparatus of claim 20, wherein each of the plurality of synchronizer VPLLs comprise a loop filter configured to accept a first control signal and a second control signal and to form a first loop filter signal, a second loop filter signal and third loop filter signal; and a numerically controlled oscillator configured to receive the first loop filter signal, the second loop filter signal and the third loop filter signal, and output an estimate target clock period, a first reference clock signal and a second reference clock signal.

\* \* \* \* \*